(12) United States Patent
Hsu et al.

(10) Patent No.: US 11,509,322 B2
(45) Date of Patent: Nov. 22, 2022

(54) LIGHT SENSOR CIRCUIT

(71) Applicant: SENSORTEK TECHNOLOGY CORP., Zhubei (TW)

(72) Inventors: Jer-Hau Hsu, Zhubei (TW); Ming-Huang Liu, Zhubei (TW); Kian-Fu Wong, Zhubei (TW)

(73) Assignee: Sensortek Technology Corp., Zhubei (TW)

( * ) Notice: Subject to any disclaimer, the term of this patent is extended or adjusted under 35 U.S.C. 154(b) by 0 days.

(21) Appl. No.: 17/014,253

(22) Filed: Sep. 8, 2020

(65) Prior Publication Data

US 2021/0250035 A1 Aug. 12, 2021

Related U.S. Application Data

(60) Provisional application No. 62/896,215, filed on Sep. 5, 2019.

(51) Int. Cl.
*H03M 1/12* (2006.01)
*G01J 1/44* (2006.01)

(52) U.S. Cl.
CPC ............... *H03M 1/12* (2013.01); *G01J 1/44* (2013.01); *G01J 2001/446* (2013.01)

(58) Field of Classification Search
CPC .... H03M 1/12; H03M 1/48; G01J 1/44; G01J 2001/446; H04N 5/355
See application file for complete search history.

(56) References Cited

U.S. PATENT DOCUMENTS

| | | | |
|---|---|---|---|
| 7,388,183 B2 | 6/2008 | Takayanagi et al. | |
| 8,797,098 B2 | 8/2014 | Kao et al. | |
| 2004/0036009 A1* | 2/2004 | Takayanagi | H01L 27/14603 |
| | | | 250/208.1 |
| 2008/0075473 A1 | 3/2008 | Iguchi | |
| 2008/0197267 A1 | 8/2008 | Mizuno et al. | |
| 2013/0314156 A1 | 11/2013 | Kao et al. | |
| 2015/0350584 A1 | 12/2015 | Fenigstein et al. | |
| 2020/0403579 A1* | 12/2020 | Hsieh | H03F 3/45197 |

FOREIGN PATENT DOCUMENTS

| | | |
|---|---|---|
| CN | 1689316 A | 10/2005 |
| CN | 1950684 A | 4/2007 |
| CN | 104427266 A | 3/2015 |
| CN | 107124184 A * | 9/2017 |

(Continued)

OTHER PUBLICATIONS

Official Action Issued by Foreign Patent Office in Application No. 202010930020.4 dated Mar. 21, 2022.

(Continued)

*Primary Examiner* — Thanh Luu
*Assistant Examiner* — Monica T Taba
(74) *Attorney, Agent, or Firm* — Rosenberg, Klein & Lee

(57) ABSTRACT

A light sensor circuit, which comprising a photodiode and a voltage follower. By setting the voltage follower to reduce the influence from the junction capacitance of the photodiode, a required time of a repeat integration module will not be influenced by the photodiode to efficiently keep the performance and the accuracy of the analog to digital converting device when the light sensor circuit is used to the analog to digital converting device in repeat operation.

7 Claims, 4 Drawing Sheets

(56) References Cited

FOREIGN PATENT DOCUMENTS

| | | |
|---|---|---|
| CN | 107124184 A | 9/2017 |
| JP | 2016220193 A | 12/2016 |
| TW | I590591 B | 7/2017 |
| WO | 0029821 A1 | 5/2000 |

OTHER PUBLICATIONS

Official Action Issued by Foreign Patent Office in Application No. 11021251430/109130665.
International Search Report Issued by Foreign Patent Office in Application No. 11021251430/109130665.

* cited by examiner

LIGHT SENSOR CIRCUIT

FIELD OF THE INVENTION

The present application refers to a light sensor circuit, particularly the one that may reduce the junction capacitance of the photodiode.

BACKGROUND OF THE INVENTION

The light sensors performed based on light sensing technology are widely utilized in many applications. For example, the ambient light sensors may be used in electronic products to sense ambient light density for automatically adjusting the screen brightness in order to upgrade the users' convenience and extending battery lifetime. Light sensor may be used to measure the distance or position in space; for example, the mobile device usually includes a proximity sensor, the proximity sensor may be used to detect the distance between user's face and the display screen of an electronic device. Therefore, when the proximity sensor is close to user's face, the electronic device may automatically turn off the display screen and touch function to prevent user's face from accidentally touching the display screen during a call and interrupting the conversation.

Generally speaking, light sensors need to use an analog-to-digital converter (ADC) for converting the analog input signal generated by sensing light into a digital signal that may be processed by a digital circuit. ADC may be used to calculate the cumulative operation of a highest effective bit and a lowest effective one, and linearly express the received analog signals in a measurable range in a digital manner, such as the binary way.

There are many types of ADC devices; each of them has different operating mechanism, characteristics and functions. In Taiwan patent No. 1590591, an ADC with high dynamic operating range and high linearity is disclosed, referring to FIG. 1, which is a simplified configuration diagram of ADC 2 disclosed in the Taiwan patent. The ADC 2 includes an input module 20, an integration module 22, a comparison module 24 and a counting module 26, that senses light through a photodiode 200 and obtains an analog input signal. The ADC 2 will be used to convert the analog input signal into a digital signal, and perform an accumulation operation of effective bit. The operation of ADC 2 is briefly described below; yet, in this patent case, the detailed operation method has been recorded in details and will not be repeated herein.

The input module 20 includes a switching module 202 and a chargeable module 204. The chargeable module 204 correspondingly performs charging or discharging operations and outputs an input voltage IN_INT to the integration module 22 allowing the integration module 220, in the goal of accumulating the analog input signals, and outputting an integral voltage O_INT to the comparison module 24. Accordingly, the comparison module 24 may decide whether the voltages of positive/negative input terminals are the same or not, that is, when the integration voltage O_INT of the positive input terminal reaches the turn-on voltage of the negative input terminal (for example, the voltage V_FS), the counting module 26 will decide whether or not the control signal O_CMP is used to accumulate an effective bit. Simultaneously, the first counting module 26 also feeds back the control signal O_CMP to reset the operation of the chargeable module 204, for example, it changes the chargeable module 204 from a discharging operation to a charging operation. In addition, before the ADC 2 is used for performing the effective bit accumulation operation, the chargeable module 204 has been switched and connected to the turn-on voltage V_FS for charging; and when the ADC 2 performs the effective bit accumulation operation, the chargeable module 204 is switched to connect to the integration module 22, and accordingly, the chargeable module 204 will discharge to output the input voltage IN_INT so that the integral voltage O_INT of integration module 22 gradually reaches the voltage V_FS. In this case, the comparison module 24 will correspondingly output the control signal O_CMP to control the counting module 26 to accumulate the effective bit by adding one on the output signal, and the control signal O_CMP will also be fed back to the switching module 202 switching the chargeable module 204 to be connected again and the turn-on voltage V_FS is turned on to perform the charging operation, and the reset operations of input module 20 and integration module 22 are completed.

However, the problem encountered by this type of ADC is that the photodiode 200 has a junction capacitance. While the amplitude of junction capacitance is larger, the reset operation of integration module 22 will be slow. For example, refer to FIG. 2. In an ideal situation, when the integral voltage O_INT reaches the voltage V_FS, it should be quickly reset to a reference voltage VCOM (it has been simplified into the ground voltage in FIG. 1). However, as affected by the junction capacitance of photodiode 200, the actual reset process of integral voltage O_INT (shown by the dotted line) will be slower, resulting in a longer time required to reset the integration module 22 and therefore affects the ADC performance or even may affect its accuracy.

Due to the mentioned problems, the present application provides a light sensor circuit that may reduce the photodiode junction capacitance and increase the charging and discharging speed of the analog front-end circuit, which therefore may solve the mentioned problems.

SUMMARY

The purpose of the present application is to provide a light sensor circuit, which includes a photodiode and a unit-gain buffer. The unit-gain buffer may largely reduce the influence made by the junction capacitance; therefore, while the light sensor circuit is applied to reset the running ADC, the time required to reset the integration module will not be influenced by the photodiode and is able to effectively keep the efficiency and accuracy of ADC.

The present application refers to a light sensor circuit, which included a photodiode that has an anode and a cathode; and a unit-gain buffer, which has an input and an output. The anode is connected to the output of the unit-gain buffer, and the cathode and the input of the unit-gain buffer are both connected to a signal terminal.

DETAILED DESCRIPTION

Some terms in the Invention Description and CLAIMs as used to specify certain devices; yet, anyone in the field of the present application with common knowledge shall be able to understand these terms; manufacturers may use different terms to call the same device, and the present application Description and CLAIMs do not use the name variety as the criterion of distinction, instead, the present application Description and CLAIMs use the difference in overall technology as the criterion. The "include" mentioned in the entire Invention Description and CLAIMs is an open term, which shall be explained as "include but not limited to". Moreover, the "connect" herein includes the direct and indirect methods. Therefore, if there is an expression of "a primary device connects to the secondary device", it means that the primary device connects to the secondary device directly or via other device or connecting means to connect to the secondary device indirectly.

Figure 3:
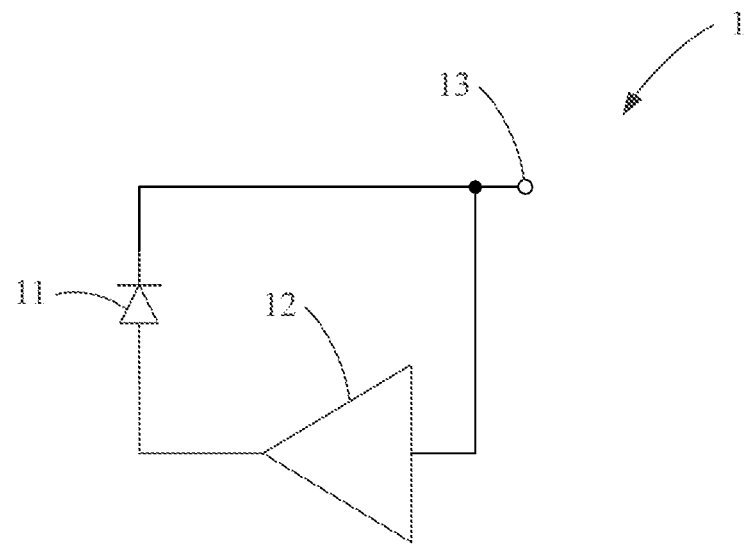
FIG. 3: The schematic diagram of a light sensor circuit in the present application.

Refer to FIG. 3; it is the schematic diagram of light sensor circuit 1 in the present application. As shown in the diagram, the light sensor circuit 1 includes a photodiode 11 and a unit-gain buffer 12. The anode of photodiode 11 connects to an output of the unit-gain buffer 12, whereas the cathode of photodiode 11 and an input of the unit-gain buffer 12 are connected to the output of a signal terminal 13, making the photodiode 11 sense light and generate analog input outputted from the signal terminal 13.

Figure 4:
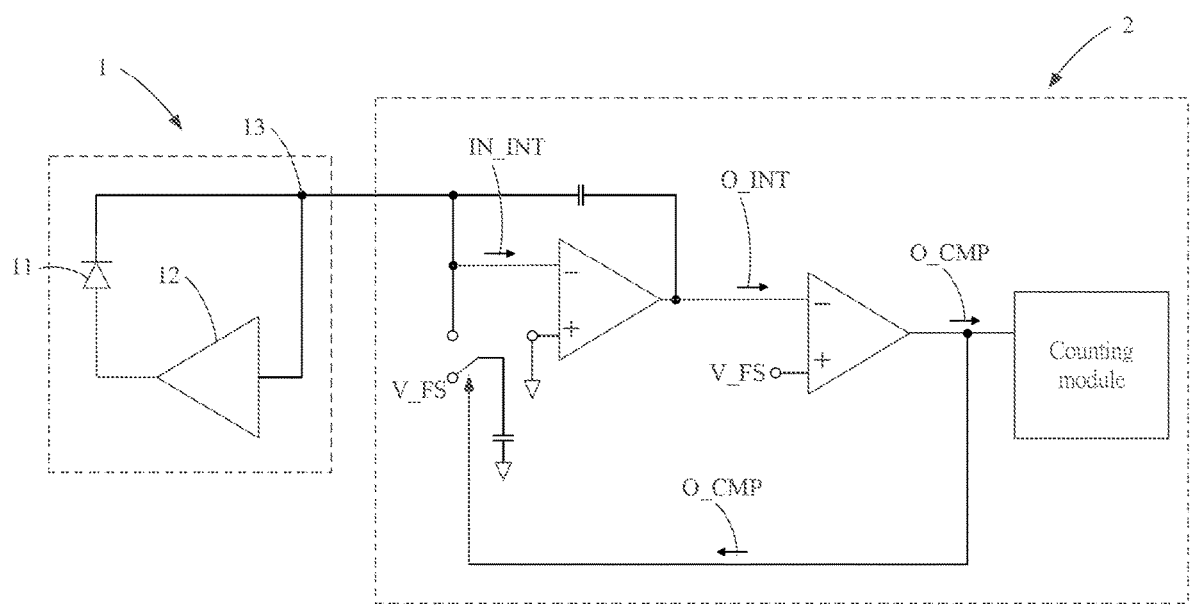
FIG. 4: The schematic diagram of practical application configuration in the present application.

Refer to FIG. 4; it is the schematic diagram of light sensor circuit in the present application. As shown in the figure, the light sensor circuit 1 may be used in the aforesaid ADC 2 or other ADCs with the same requirement; the present application will not be limited from this. The circuit assembly of the aforesaid ADC 2 is mentioned above and will not be re-described herein. The signal terminal 13 of light sensor circuit 1 may be connected to ADC 2 and outputs the analog signal generated from photodiode 11 to ADC 2.

Figure 1:
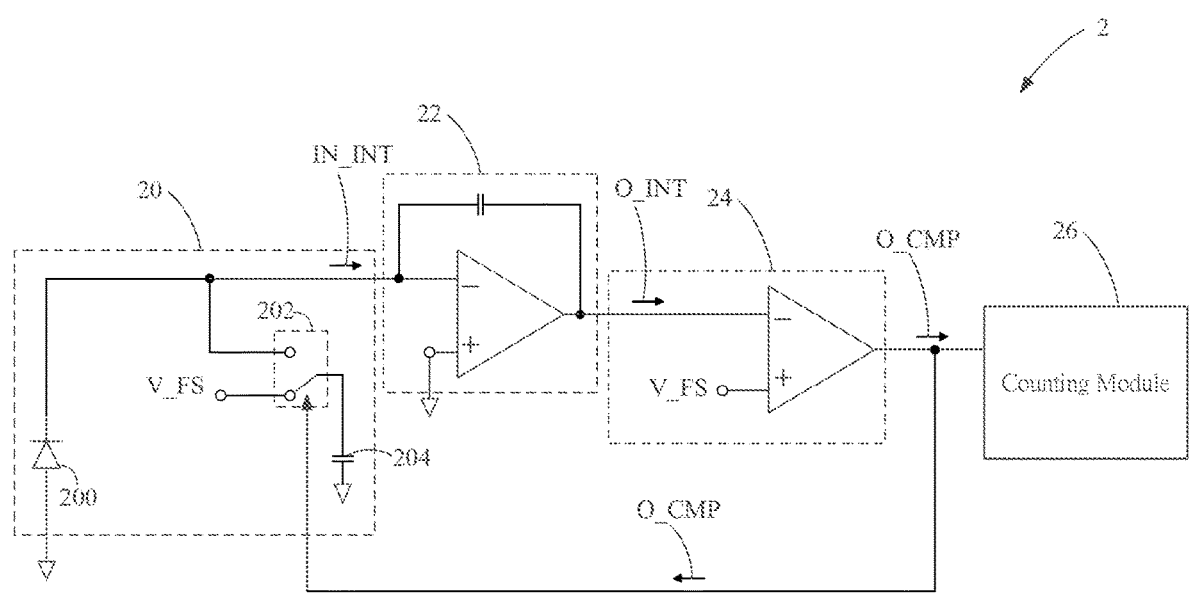
FIG. 1: The schematic diagram of the present analog-digital converting circuit.
Figure 2:
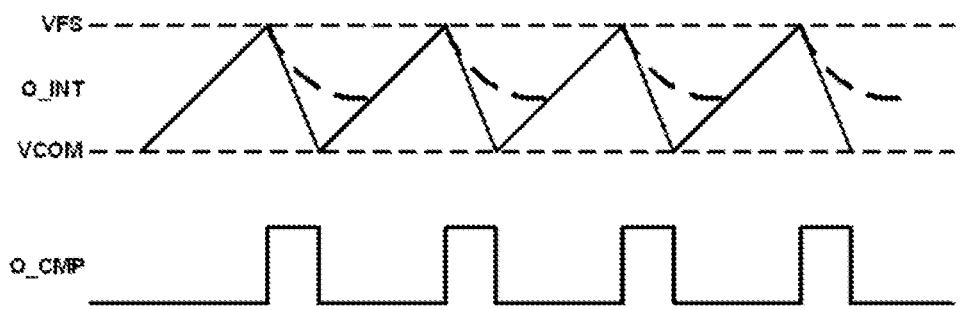
FIG. 2: The schematic diagram of the present analog-digital converting circuit signals.

Since the unit-gain buffer 12 may directly feedback the voltage on signal terminal 13 to the anode of photodiode 11, making both ends of photodiode 11 will not be affected by the fluctuation of transient voltage, and the junction capacitance of photodiode 11 will not form charge/discharge current. From this feature, the light sensor circuit 1 of the present application may let the photodiode 11 junction capacitance of photodiode 11 equivalently approach zero and thus ensure that after the integral voltage O_INT of the ADC 2 reaches the turn-on voltage V FS, it will be fast reset to the reference voltage VCOM. In brief, refer to FIG. 2, comparing to the well-known technology that under the influence of junction capacitance from photodiode 200, the actual reset process of integration voltage O_INT (shown by the dotted line) will be slower, the present application may largely lower down the influence caused by the junction capacitance of photodiode 11, thus the actual reset speed of integral voltage O_INT will not slow down (sustained as shown by the solid line), time required to reset the integration module 22 remains unchanged, which effectively maintain performance and accuracy of the ADC.

Figure 5:
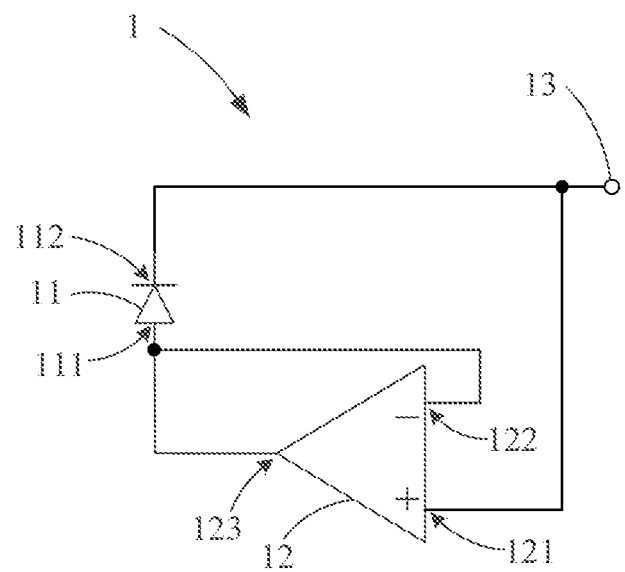
FIG. 5: The schematic diagram of a light sensor circuit in one embodiment of the present application.

Refer to FIG. 5; it is the circuit diagram of an embodiment in the light sensor circuit of the present application. The unit-gain buffer 12 may use an Operational Amplifier (OP) to work, in which the unit-gain buffer 12 includes a non-inverse-phase input terminal 121, an inverse-phase input terminal 122 and an output terminal 123. The inverse-phase input terminal 122 and output terminal 123 connect each other as the output of unit-gain buffer 12, connected to the Anode 111 of the photodiode 11. The non-inverse-phase input terminal 121 is the input of unit-gain buffer 12, connected to signal terminal 13 and the cathode 112 of photodiode 11.

If the open loop gain of aforesaid Operational Amplifier (OP) is expressed as A(s) and the junction capacitance of photodiode 11 is Cj, then, in the light sensor circuit embodiment of the present application, by means of equipping the Operational Amplifier (OP) as the unit-gain buffer 12, it may make the equivalent visible junction capacitance photodiode 11 approximately become Cj/[1+A(s)]. Since normally the open-circuit gain of an Operational Amplifier is very large, therefore, the embodiment of the present application may indeed make the visible junction capacitance of photodiode 11 equivalently approach zero.

Figure 6A:
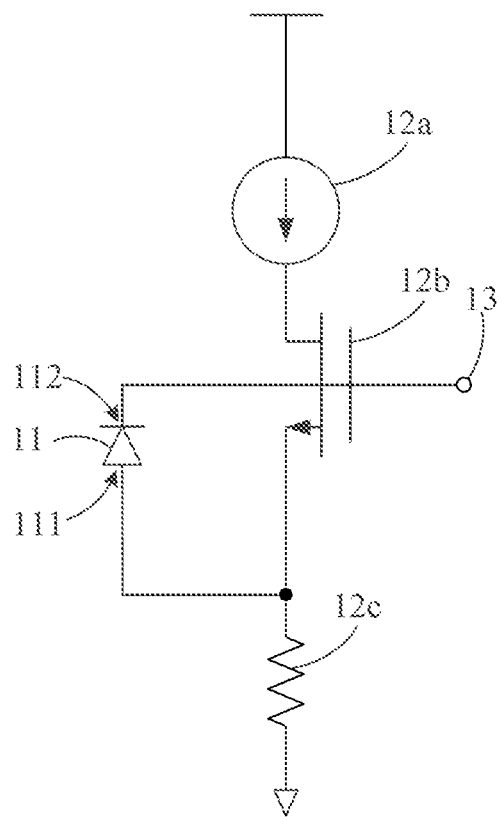
FIG. 6A: The schematic diagram of the detailed design of light sensor circuit in the other embodiment of the present application.
Figure 6B:
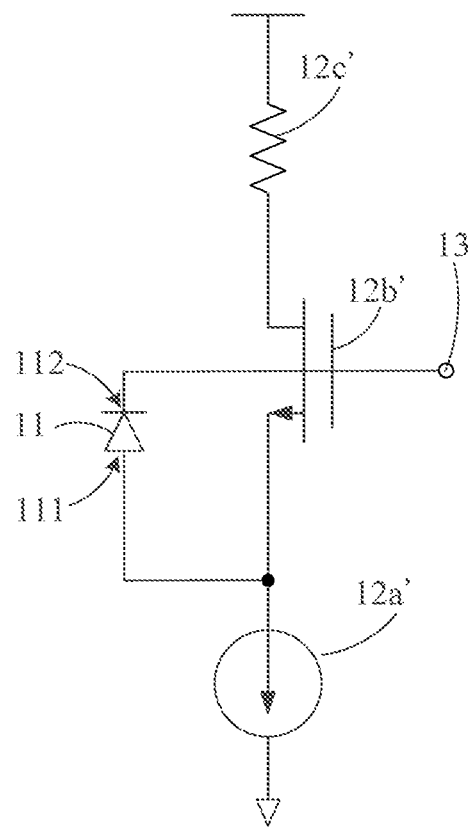
FIG. 6B: The schematic diagram of the detailed design of light sensor circuit in the other embodiment of the present application.

Refer to FIG. 6A; it is the schematic diagram of detailed design of light sensor circuit in the other embodiment of the present application. As compared with the aforesaid embodiment that an Operational Amplifier (OP) is served as the unit-gain buffer 12, the present application also may combine the current sources 12a, 12a', transistors 12b, 12b' and Resistors 2c, 12c' into a one-stage amplifier served as the unit-gain buffer 12 and further simplifies the complicity of the circuit in the present application as well as reduces the cost, wherein, for example, the transistors 12b, 12b' are token as the metal-oxide-semiconductor field-effect transistors (MOSFET), the current sources 12a, 12a', transistors 12b, 12b' and Resistors 12c, 12c' may be integrated into a common drain amplifier, the sources of transistors 12b, 12b' are the output of unit-gain buffer 12 connected to the anode 111 of photodiode 11. The gates of transistor 12b, 12b' are the input of unit-gain buffer 12 connected to signal terminal 13 and cathode 112 of photodiode 11. The current sources 12a, 12a' and Resistors 12c, 12c' are, respectively, connected to the drains and sources of Transistor 12b, 12b to provide bias. Similarly, if the open loop gain of the aforesaid common-drain amplifier is equivalent to A(s), the visible junction capacitance of the photodiode 11 is also equivalent to about Cj/[1+A(s))].

In conclusion, the present application provides a light sensor circuit, which includes a photodiode and a unit-gain buffer. By means of the unit-gain buffer, the visible junction capacitance of photodiode is equivalently approached to zero, which may largely reduce the influence of junction capacitance in photodiode; therefore, while the light sensor circuit is applied to ADC that needs to make reset operation, time required by the Reset integration module would not affected by the photodiode, and effectively maintain the ADC performance and accuracy.

The invention claimed is:
1. A light sensor circuit, which includes:
a photodiode with an anode and a cathode; and
a unit-gain buffer with an input and an output;
wherein the anode connects to the output of the unit-gain buffer, whereas the cathode and the input of the unit-gain buffer connect to a signal terminal, and the signal terminal of light sensor circuit connects to an ADC that includes an integration module, the voltage of the integration module needs to be reset.

2. The light sensor circuit of claim 1, wherein the photodiode will senses light and generates an analog input signal outputted from the signal terminal.

3. The light sensor circuit of claim 1, wherein the unit-gain buffer includes an operational amplifier (OP), which includes a non-inverse-phase input terminal, an inverse-phase input terminal and an output terminal; the inverse-phase input terminal and output terminal of the operational amplifier (OP) connect to each other and served as the output of the unit-gain buffer, connected to the anode; the non-inverse-phase input terminal served as the input of unit-gain buffer, connected to the signal terminal and cathode of the photodiode.

4. The light sensor circuit of claim 1, wherein the unit-gain buffer includes a one-stage amplifier consists of a current source, a transistor and a resistor.

5. The light sensor circuit of claim 4, wherein the transistor is a metal oxide semiconductor field effect transistor (MOSFET), and the current source, the transistor and the resistor form a common-drain amplifier.

6. The light sensor circuit of claim 5, wherein the source of the transistor is served as the output of the unit-gain buffer, which connects to the anode, and the gate of the transistor is served as the input of the unit-gain buffer, which connects to the signal terminal and the cathode, the current source connects to the source of the transistor, and the resistor connects to the drain of the transistor.

7. A light sensor circuit, which includes:
a photodiode with an anode and a cathode; and
a unit-gain buffer with an input terminal and an output terminal, wherein the unit-gain buffer includes a one-stage amplifier consists of a current source, a transistor and a resistor;
wherein the anode connects to the output of the unit-gain buffer, whereas the cathode and the input of the unit-gain buffer connect to a signal terminal, wherein the source of the transistor is served as the output of the unit-gain buffer, which connects to the anode, and the gate of transistor is served as the input of unit-gain buffer, which connects to the signal terminal and the cathode, the current source connects to the drain of the transistor, and the resistor connects to the source of the transistor.

* * * * *